US012658238B2

(12) United States Patent
Kim et al.

(10) Patent No.: US 12,658,238 B2
(45) Date of Patent: Jun. 16, 2026

(54) ROW DECODERS HAVING TRANSISTORS PLACED IN A PLURALITY OF ROWS AND MEMORY DEVICES INCLUDING THE SAME

(71) Applicant: Samsung Electronics Co., Ltd., Suwon-si (KR)

(72) Inventors: Kyoungmin Kim, Suwon-si (KR); Minchae Kim, Suwon-si (KR); Sujin Park, Suwon-si (KR); Bok-Yeon Won, Suwon-si (KR); Bumjae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 228 days.

(21) Appl. No.: 18/525,276

(22) Filed: Nov. 30, 2023

(65) Prior Publication Data

US 2024/0386940 A1     Nov. 21, 2024

(30) Foreign Application Priority Data

May 19, 2023     (KR) ........................ 10-2023-0065018

(51) Int. Cl.
G11C 11/408 (2006.01)

(52) U.S. Cl.
CPC ...... G11C 11/4087 (2013.01); G11C 11/4085 (2013.01)

(58) Field of Classification Search
CPC . G11C 11/4087; G11C 11/4085; G11C 16/08; G11C 16/06; G11C 8/10; G11C 8/08

USPC ..................................................... 365/230.06
See application file for complete search history.

(56) References Cited

U.S. PATENT DOCUMENTS

| | | | |
|---|---|---|---|
| 6,226,218 B1 | 5/2001 | Kim | |
| 7,729,195 B2 | 6/2010 | Youn et al. | |
| 8,259,493 B2 | 9/2012 | Ohta et al. | |
| 9,318,175 B1 | 4/2016 | Chi | |
| 10,008,256 B1 | 6/2018 | Kim | |
| 11,289,140 B2 | 3/2022 | Jeong | |
| 11,488,655 B2 | 11/2022 | Miyatake | |
| 2021/0057009 A1* | 2/2021 | Kim ................... | G11C 11/4085 |

FOREIGN PATENT DOCUMENTS

CN          113140243 A  *  7/2021  ......... G11C 11/4085

* cited by examiner

*Primary Examiner* — Huan Hoang
(74) *Attorney, Agent, or Firm* — Wolf, Greenfield & Sacks, P.C.

(57)          ABSTRACT

A row decoder includes first and second main wordline driving circuits, which are configured to generate respective first and second driving signals onto corresponding first and second main wordlines extending adjacent to each other. In addition, a first transistor within the first main wordline driving circuit and a second transistor within the second main wordline driving circuit have the same function, but extend in different rows when viewed in a direction perpendicular to a substrate on which the first and second main wordlines are formed.

20 Claims, 11 Drawing Sheets

ROW DECODERS HAVING TRANSISTORS PLACED IN A PLURALITY OF ROWS AND MEMORY DEVICES INCLUDING THE SAME

REFERENCE TO PRIORITY APPLICATION

This U.S. non-provisional application claims priority under 35 USC § 119 to Korean Patent Application No. 10-2023-0065018, filed May 19, 2023, the disclosure of which is hereby incorporated herein by reference.

BACKGROUND

Example embodiments relate to integrated circuit devices and, more particularly, to integrated circuit memory devices and row decoders therein.

Storage capacity of memory devices is constantly increasing. As the storage capacity of memory devices increases, a pitch between adjacent wordlines selecting memory cells (a cell pitch) is typically reduced. As the pitch between adjacent wordlines is reduced, the sizes of transistors included in a wordline driving circuit are similarly reduced to account for the smaller pitch. Unfortunately, when the sizes of transistors are reduced below a certain level, the performance of the transistors within a wordline driving circuit may deteriorate, such as when a high voltage (VPP) is applied to the wordline driving circuit.

SUMMARY

Example embodiments provide row decoders configured to prevent deterioration of transistors therein and improve reliability, and memory devices including said row decoders.

According to an example embodiment, a row decoder includes a first main wordline driving circuit and a second main wordline driving circuit, each of which includes a plurality of transistors and is configured to generate driving signals of different main wordlines extending adjacent to each other. Among the plurality of transistors, a first transistor of the first main wordline driving circuit and a second transistor of the second main wordline driving circuit may be disposed in different rows when viewed in a direction perpendicular to a substrate; the first transistor and the second transistor may have the same function.

According to another example embodiment, a row decoder includes a plurality of main wordline driving circuits disposed consecutively in a first direction parallel to a plane of a substrate and configured to respectively generate driving signals associated with different main wordlines. Each of the plurality of main wordline driving circuits may include a plurality of transistors disposed in a second direction, parallel to the plane and perpendicular to the first direction. In each of a first main wordline driving circuit and a second main wordline driving circuit, which adjacent to each other, at least some of the plurality of transistors, which functionally correspond to each other, may be disposed in different relative locations.

According to a further example embodiment, a memory device includes a first main wordline driving circuit, which is configured to provide a wordline driving signal to a first sub-wordline group, and a second main wordline driving circuit, which is configured to provide a wordline driving signal to a second sub-wordline group. One or more first transistors that perform the same function in each of the first main wordline driving circuit and the second main wordline driving circuit, may be disposed in different rows when viewed in a direction perpendicular to a plane of a substrate.

Each of the first sub-wordline group and the second sub-wordline group may include a plurality of sub-wordline drivers.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
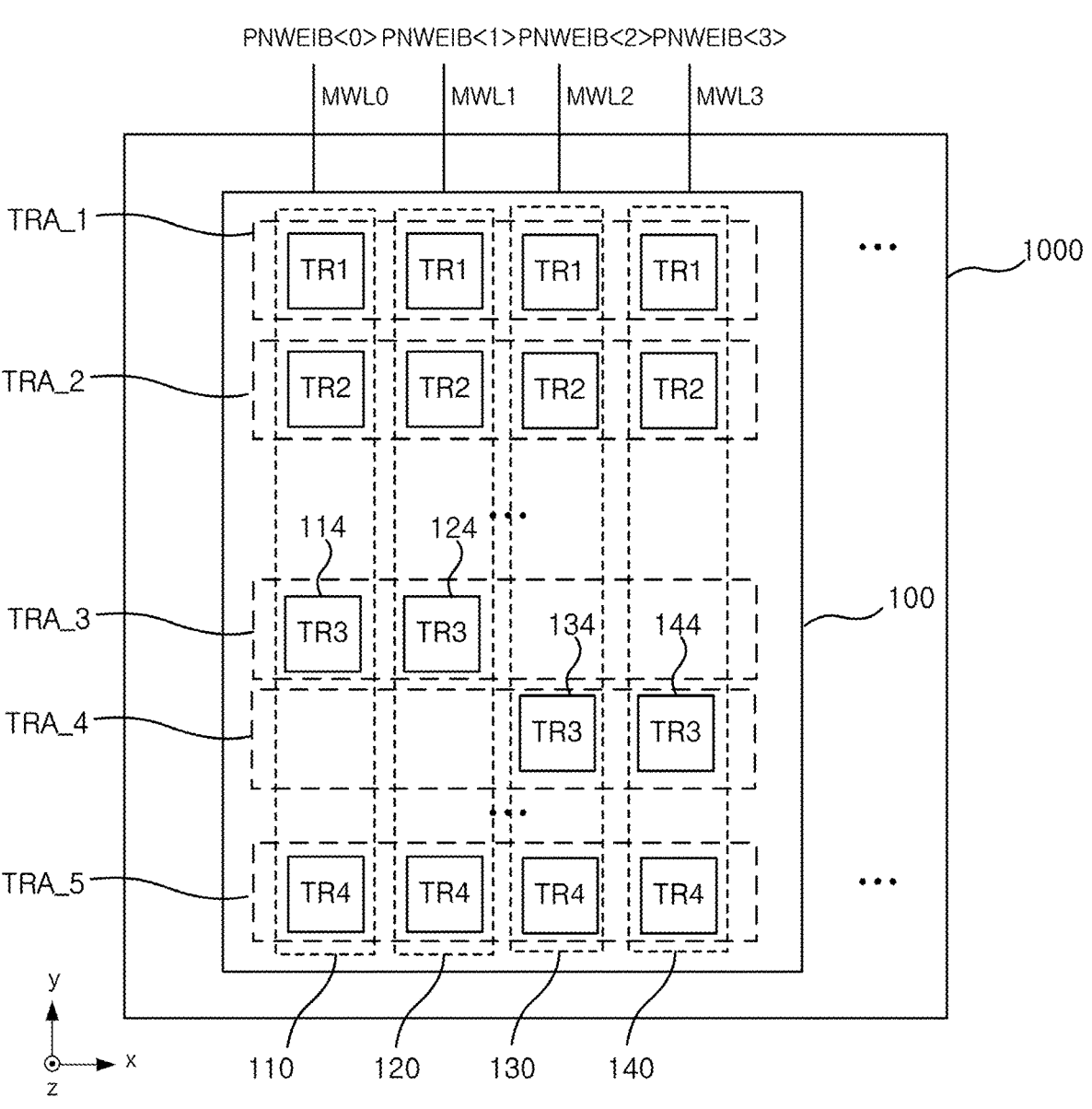
FIG. 1 is a block plan view illustrating a row decoder of a memory device according to an example embodiment.

FIG. 1 is a block diagram illustrating a row decoder 100 of a memory device 1000 according to an example embodiment. Referring to FIG. 1, the row decoder 100 of the memory device 1000 may include a plurality of wordline driving circuits 110, 120, 130, and 140. As will be understood by those skilled in the art, the memory device 1000 may be a memory used in a computing device such as a smartphone, a tablet personal computer (PC), a laptop computer, a desktop computer, or a server computer. The memory device may be a volatile memory device such as a dynamic random access memory (DRAM) or a nonvolatile memory device such as a flash memory. In the present disclosure, a row decoder will be described as being a row decoder of a DRAM. However, example embodiments are not limited thereto, and the row decoder may be a row decoder of a flash memory or other volatile and nonvolatile memory devices.

The row decoder 100 may generate a main "multi-bit" wordline driving signal PNWEIB for driving a main wordline in response to a row address signal. The row decoder 100 may include a plurality of main wordline driving circuits 110, 120, 130, and 140. In FIG. 1, four main wordline driving circuits are illustrated, but the row decoder 100 may include more main wordline driving circuits according to the storage capacity of the row coder 100 in actual implementation. The plurality of main wordline driving circuits 110, 120, 130, and 140 may provide driving signals PNWEIB<0>, PNWEIB<1>, PNWEIB<2>, and PNWEIB<3> driving different main wordlines MWL0, MWL1, MWL2, and MWL3, respectively. The corresponding main wordlines MWL0, MWL1, MWL2, and MWL3 may be driven in response to the respective driving signals.

Figure 2:
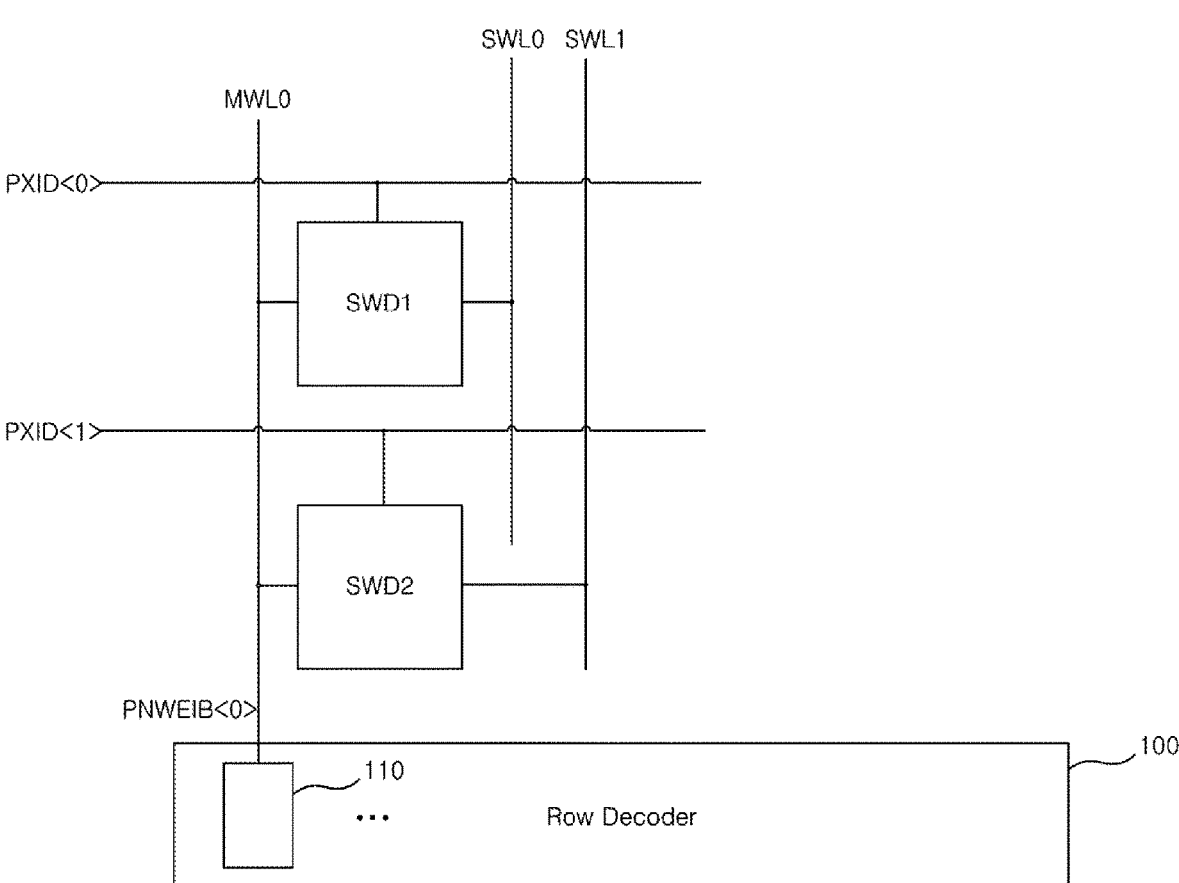
FIG. 2 is a diagram illustrating a row decoder and a sub-wordline driver according to an example embodiment.

Referring to FIG. 2, a single main wordline driving circuit 110 may drive a corresponding main wordline MWL0. A plurality of sub-wordline drivers SWD1 and SWD2 may be connected to a single main wordline. A plurality of sub-wordline drivers, connected to the same main wordline, may drive a sub-wordline in response to a main wordline driving signal PNWEIB and a sub-wordline driver driving signal PXID provided through a main wordline. Only one sub-wordline driver driving signal PXID is illustrated in FIG. 2, but a plurality of sub-wordline driver driving signals may be provided according to example embodiments. For example, one of the plurality of sub-wordlines SWL0 and SWL1, connected to the same main wordline MWL0, may be driven. In FIG. 2, two sub-wordline drivers SWD1 and SWD2 are illustrated as being connected to a single main wordline MWL0, but more sub-wordline drivers may be connected to a single main wordline. Similarly to the main wordline driving circuit 110, the other main wordline driving circuits 120, 130, and 140 may also drive corresponding main wordlines MWL1, MWL2, and MWL3, respectively. In addition, a plurality of sub-wordline drivers may be connected to each of the main wordlines MWL1, MWL2, and MWL3.

Returning to FIG. 1, the row decoder 100 according to an example embodiment will be described in detail. Each of the main wordline driving circuits 110, 120, 130, and 140 of the row decoder 100 according to an example embodiment may include a plurality of transistors TR1, TR2, TR3, and TR4. Each of the main wordline driving circuits 110, 120, 130, and 140 may include transistors TR1, TR2, TR3, and TR4, functionally corresponding to each other between main wordline driving circuits. In FIG. 1, each of the wordline driving circuits 110, 120, 130, and 140 are illustrated as including four transistors. However, each of the wordline driving circuits 110, 120, 130, and 140 may include more or fewer transistors.

The main wordline driving circuits 110, 120, 130, and 140 may be disposed parallel to each other in a column structure when viewed in a direction (a Z-direction), perpendicular to a plane of a substrate. In example embodiments, the plane of the substrate may be a front surface or a rear surface of the substrate. In addition, each of the main wordline driving circuits 110, 120, 130, and 140 may be disposed, parallel to a direction (a Y-direction) in which the main wordlines MWL0, MWL1, MWL2, and MWL3 extend, when viewed in a direction (a Z-direction), perpendicular to the plane of the substrate. The main wordline driving circuits 110, 120, 130, and 140 may be consecutively disposed in a first direction, parallel to the plane of the substrate, when viewed in the direction (the Z-direction), perpendicular to the plane of the substrate. The first direction may be the X-direction or the Y-direction.

The plurality of transistors TR1, TR2, TR3, and TR4, included in each of the main word line driving circuits 110, 120, 130, and 140 and functionally corresponding to each other, may be disposed in a direction (a Y-direction) in which the main wordlines MWL0, MWL1, MWL2, and MWL3 extend when viewed in the direction (the Z-direction), perpendicular to the plane of the substrate.

The plurality of transistors TR1, TR2, TR3, and TR4, included in each of the main word line driving circuits 110, 120, 130, and 140 and functionally corresponding to each other, may be disposed in a second direction, parallel to the plane of the substrate and perpendicular to the first direction, when viewed in the direction (the Z-direction), perpendicular to the plane of the substrate. At least a portion of the plurality of transistors TR1, TR2, TR3, and TR4, which are included in each of the main word line driving circuits 110, 120, 130, and 140 and functionally corresponding to each other, may be disposed adjacent to each other in the second direction, and another portion thereof may be disposed to be spaced apart from each other in the second direction.

Among the plurality of transistors TR1, TR2, TR3, and TR4 included in each of the main wordline driving circuits 110, 120, 130, and 140 and functionally corresponding to each other, some transistors TR1, TR2, and TR4 may be disposed in the same row TRA_1, TRA_2, and TRA_5. A row may be in a direction, which is perpendicular to the direction (the Y-direction) along columns of the wordline driving circuits 110, 120, 130, and 140. Alternatively, the row may be in a direction, which is perpendicular to the direction (the Y-direction) in which wordline extend. The direction, in which wordline extend, may be a direction in which the main wordlines MWL0, MWL1, MWL2, and MWL3 extend.

Among the plurality of transistors TR1, TR2, TR3, and TR4 included in each of the main wordline driving circuits 110, 120, 130, and 140 and functionally corresponding to each other, some transistors TR3 may be disposed in different rows. Referring to FIG. 1, the transistors (TR3) 114 and 124 of the first wordline driving circuit 110 and the second wordline driving circuit 120 may be disposed in the same row TRA_3. The transistors (TR3) 134 and 144 of the third wordline driving circuit 130 and the fourth wordline driving circuit 140 may be disposed in a row TRA_4, different from the row TRA_3 in which the transistors (TR3) 114 and 124 of the first wordline driving circuit 110 and the second wordline driving circuit 120 are disposed.

In FIG. 1, the transistor TR3 is illustrated as being disposed in different rows for each of the two main wordline driving circuits. However, the transistor TR3 may be disposed in different rows for each main wordline driving circuit. Alternatively, the transistor TR3 may be disposed in different rows for each of more than two main wordline driving circuits.

Hereinafter, a description will be provided with respect to the first direction and the second direction. Among the plurality of transistors TR1, TR2, TR3, and TR4 included in each of the main wordline driving circuits 110, 120, 130, and 140 and functionally corresponding to each other, some transistors TR1, TR2, and TR4 may be disposed in the same location in the second direction. Some transistors TR3 in adjacent main wordlines 120 and 130 may be disposed in different locations in the second direction. Accordingly, transistors that become vulnerable due to shrinkage of a cell pitch of a main wordline may be disposed in different rows to increase a gate width of the transistor or to increase a gap between a gate and a contact of an active region. As a result, the row decoder may be prevented from deteriorating and may have improved reliability.

Among the plurality of transistors included in the main wordline driving circuit, transistors significantly affected by an applied high voltage VPP may be disposed in different rows to prevent the row decoder from deteriorating and to improve reliability of the row decoder without significant sacrifice in size of the row decoder. Hereinafter, example embodiments of layouts of transistors in FIGS. 4 to 11 will be described in detail.

Figure 3:
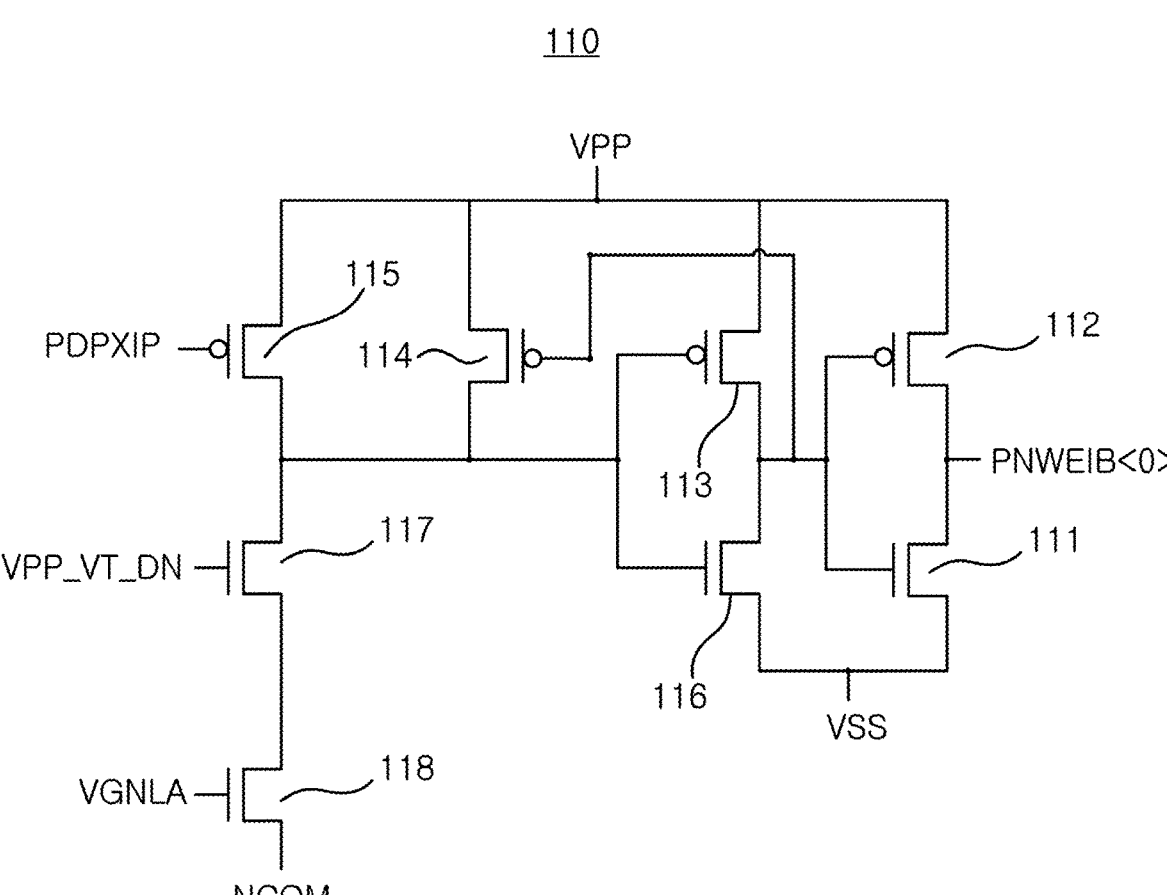
FIG. 3 is a circuit diagram of a main wordline driving circuit according to an example embodiment.

FIG. 3 is a circuit diagram of the first main wordline driving circuit 110 of the row decoder 100, according to an example embodiment. A plurality of main wordline driving circuits included in the same row decoder 100 may include the same circuit as the first main wordline driving circuit 110. The first main wordline driving circuit 110 of the row decoder 100 may include a plurality of transistors 111 (NMOS), 112 (PMOS), 113 (PMOS), 114 (PMOS), 115 (PMOS), 116 (NMOS), 117 (NMOS), and 118 (NMOS). As shown, a P-channel metal oxide semiconductor (PMOS) transistor 115 according to an example embodiment may have a gate terminal responsive to a precharge control signal PDPXIP, a source terminal connected to a driving voltage VPP, and a drain terminal connected to a series combination of a plurality of N-channel metal oxide semiconductor (NMOS) transistors 117 and 118. In addition, the transistors 113 and 116 of a first inverter circuit may be connected in series to the source terminal of the PMOS transistor 115 (and VPP), whereas the transistors 111 and 112 of a second inverter circuit may be connected in series and receive an output signal generated by the first inverter circuit. The second inverter circuit may output a single bit of the wordline driving signal, as PNWEIB<0>.

When the memory device 1000 performs a precharge operation, the PMOS transistor 115 may be turned on in response to a low-level precharge control signal PDPXIP, while the source terminal of the PMOS transistor 115 is held at a level of the driving voltage VPP. Accordingly, the wordline driving signal PNWEIB<0> may be driven to (or maintained at) a logic high level (e.g., VPP), and the second inverter circuit may disable a wordline MWL0 corresponding to the wordline driving signal PNWEIB<0>, an inverted signal.

When the memory device 1000 performs a data access operation, such as a data write operation or a data read operation, the PMOS transistor 115 may be turned off in response to a high-level precharge control signal PDPXIP, but the plurality of NMOS transistors 117 and 118, which are connected in series to the PMOS transistor 115, may be turned on, so that a drain node of the PMOS transistor 115 may be applied with a ground voltage VSS through an NCOM signal. A negative voltage may be applied based on a driving scheme.

As shown, the NMOS transistor 118 may be turned on or off based on a control signal VGNLA, which may be a signal responding to a row address. In addition, the first main wordline driving circuit 110 of the row decoder 100 according to an example embodiment may include a field relaxation transistor 117 between the PMOS transistor 115 and an NMOS transistor 118. The field relaxation transistor 117 may be turned on or off based on a control signal VPP_VT_DN. In an example embodiment, the control signal VPP_VT_DN of the field relaxation transistor 117 may be maintained at a logic high level in both a precharge operation and a data access operation of the memory device 1000. For example, the field relaxation transistor 117 may be turned on in both the precharge operation and the data access operation of the memory device 1000. When transistors having a thin gate oxide are connected to the NMOS transistor 118, the driving voltage VPP may be directly applied to the transistors to deteriorate the transistors. Accordingly, when transistors having a thin gate oxide are connected to the NMOS transistor 118, deterioration of the transistors connected to the NMOS transistor 118 may be prevented by the field relaxation transistor 117.

The first main wordline driving circuit 110 of the row decoder 100 according to an example embodiment may include a keeping transistor 114, which has as a gate terminal connected to an output terminal of the first inverter circuit (including MOS transistors 113 and 116), a source terminal connected to the driving voltage VPP, and a drain terminal connected to an input terminal of the first inverter circuit. As shown, the output terminal of the first inverter circuit may be connected, as feedback, to a gate terminal of the keeping transistor 114, which may serve to maintain an output voltage at the drain terminal of the PMOS transistor 115 to ensure a stable operation of the row decoder 100. Thus, reliability of the row decoder 100 may be improved.

The transistors 111, 112, 113, 114, 115, 116, 117, and 118 according to the circuit of FIG. 3 may be disposed from a row close to a core. For example, the NMOS transistor 111 of the second inverter circuit, the PMOS transistor 112 of the second inverter circuit, the PMOS transistor 113 of the first inverter circuit, the keeping transistor 114, the PMOS transistor 115, the NMOS transistor 116 of the first inverter circuit, the field relaxation transistor 117, and the NMOS transistor 118 may be sequentially disposed from the row close to the core. The above-mentioned transistors may be disposed in other orders and forms.

Figure 4:
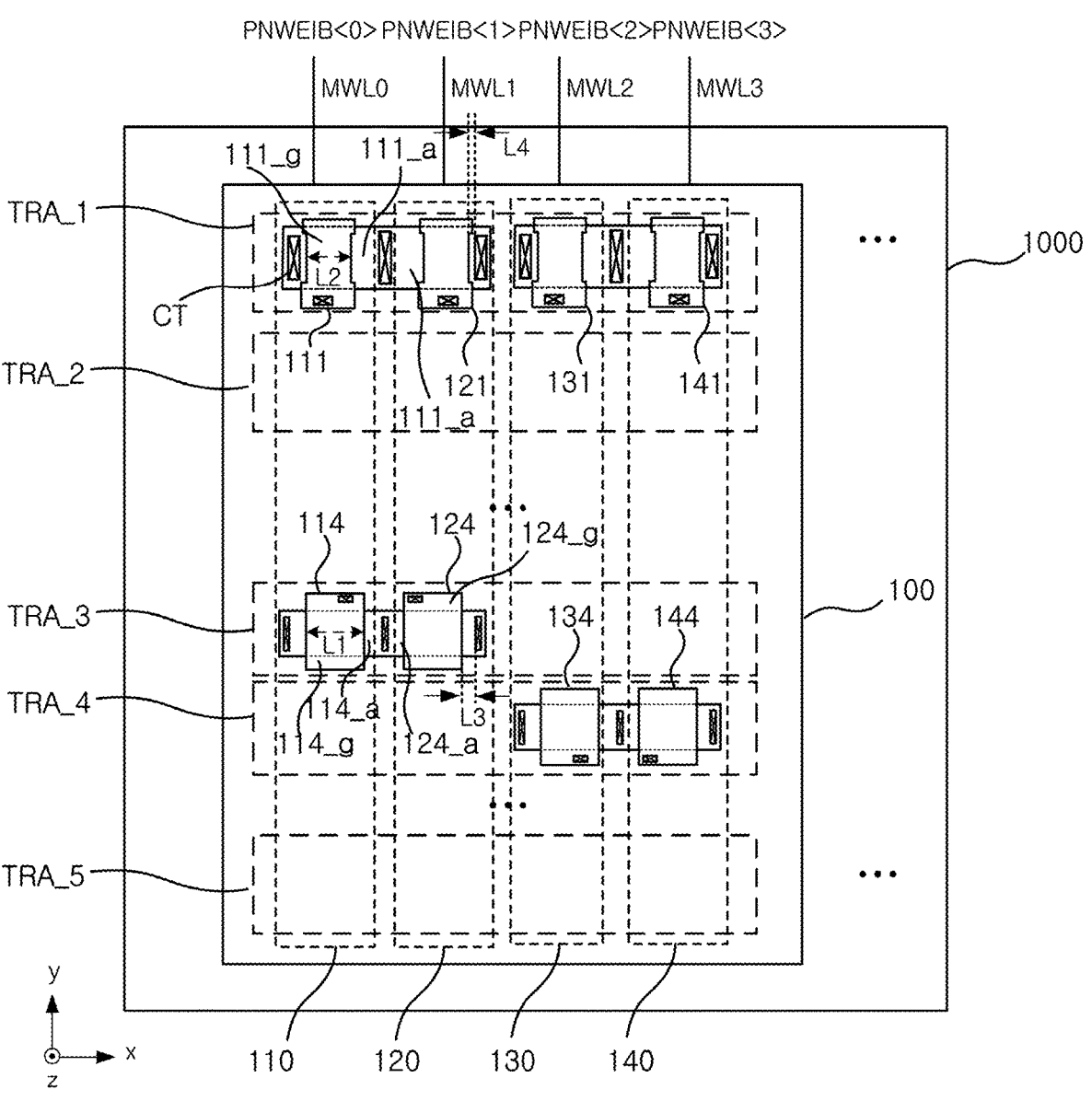
FIG. 4 is a plan view illustrating an example of a layout of transistors in a row decoder according to an example embodiment.

FIG. 4 illustrates an example of a layout of transistors of the main wordline driving circuits 110, 120, 130, and 14 of the row decoder 100 according to an example embodiment. The layout of FIG. 4 will be described on the premise of the main wordline driving circuit described with reference to FIG. 3. While only NMOS transistors 111, 121, 131, 141 and keeping transistors 114, 124, 134, and 144 of a second inverter circuit of each of the main wordline driving circuits 110, 120, 130, and 140 are illustrated, other transistors described with reference to FIG. 3 are omitted for brevity of the drawing.

Among a plurality of transistors included in each of the main wordline driving circuits 110, 120, 130, and 140 of the row decoder 100 and functionally corresponding to each other, some transistors 111, 121, 131, and 141 may be disposed in the same row TRA_1. A row may be in a direction, perpendicular to a column structure of the wordline driving circuits 110, 120, 130, and 140. Alternatively, the row may be in a direction that is perpendicular to a direction in which a wordline extends, and the direction in which the wordline extends may be a direction in which main wordlines MWL0, MWL1, MWL2, and MWL3 extend.

Among the NMOS transistors 111, 121, 131, and 141 of the second inverter circuit, some NMOS transistors may share a portion of the active region 111_a. For example, the NMOS transistors 111 and 121 may share a portion of an active region, and the NMOS transistors 131 and 141 may share a portion of the active region. The active region may include a region of the substrate in which a source terminal and/or a drain terminal are formed. A contact CT for a node receiving a control signal or connected to another transistor, or the like, may be formed in a gate (for example, 111_g) and an active region (for example, 111_a) of the NMOS transistors 111, 121, 131, and 141.

The other transistors 112, 113, 115, 116, and 118 of the first main wordline driving circuit 110 described with reference to FIG. 3 and corresponding transistors of the other main wordline driving circuits 120, 130, and 140 may also be disposed in the same row.

Among the plurality of transistors, included in the main wordline driving circuits 110, 120, 130, and 140 and functionally corresponding to each other, some transistors 114, 124, and 134 may be disposed in different rows. For example, the transistors disposed in different rows may be the keeping transistors 114, 124, 134, and 144.

In FIG. 4, the keeping transistors 114, 124, 134, and 144 are illustrated as being disposed in different rows for each of the two main wordline driving circuits. However, the keeping transistors 114, 124, 134, and 144 may be disposed in different rows for each individual main wordline driving circuit. Alternatively, the keeping transistors 114, 124, 134, and 144 may be disposed in different rows for each of more than two main wordline driving circuits.

The keeping transistors 114 and 124 disposed in the same row may share a portion of the active regions 114_a and 124_a. In particular, the keeping transistors 114, 124, 134, and 144 of the entire main wordline circuits 110, 120, 130, and 140 are not all disposed on the same row, but at least a portion of the keeping transistors 114, 124, 134, and 144 is disposed in different rows. Therefore, a layout margin may be obtained in a direction (an X-direction) along rows of the keeping transistors.

A gate length L1, a width of a gate 114_g of the keeping transistor 114 in the direction along the row, may be greater than a length L2 of a gate 111_g of another transistor, for example, the transistor 111. Alternatively, a gate may have a major axis in a direction (a Y-direction) in which rows extend and a minor axis in a direction (the X-direction) in which columns extend, and the length L1 of the short axis of the gate 114_g of the keeping transistor 114 may be greater than the length L2 of the gate of another transistor. Accordingly, a width of the gate may be increased to prevent the transistor from deteriorating.

A distance L3 between the gate 124_g of the keeping transistor 124 and a contact formed in an active region 124_a may be greater than a distance L4 between a gate of another transistor, for example, the transistor 121 and a contact formed in an active region. Therefore, a distance between the gate and a contact formed in an active region may be increased to prevent the transistor from deteriorating.

In FIG. 4, the transistors disposed in different rows have been described as being the keeping transistors 114, 124, 134, and 144. However, the transistors disposed in different rows may be other transistors of the main wordline driving circuit. For example, the field relaxation transistors 117, 127, 137, and 147 may be disposed in the same layout as the keeping transistors 114, 124, 134, and 144 of FIG. In this case, lengths of minor axes of gates of transistors disposed in different rows may be increased. A distance between the gate and the contact formed in the active region may be increased.

Figure 5:
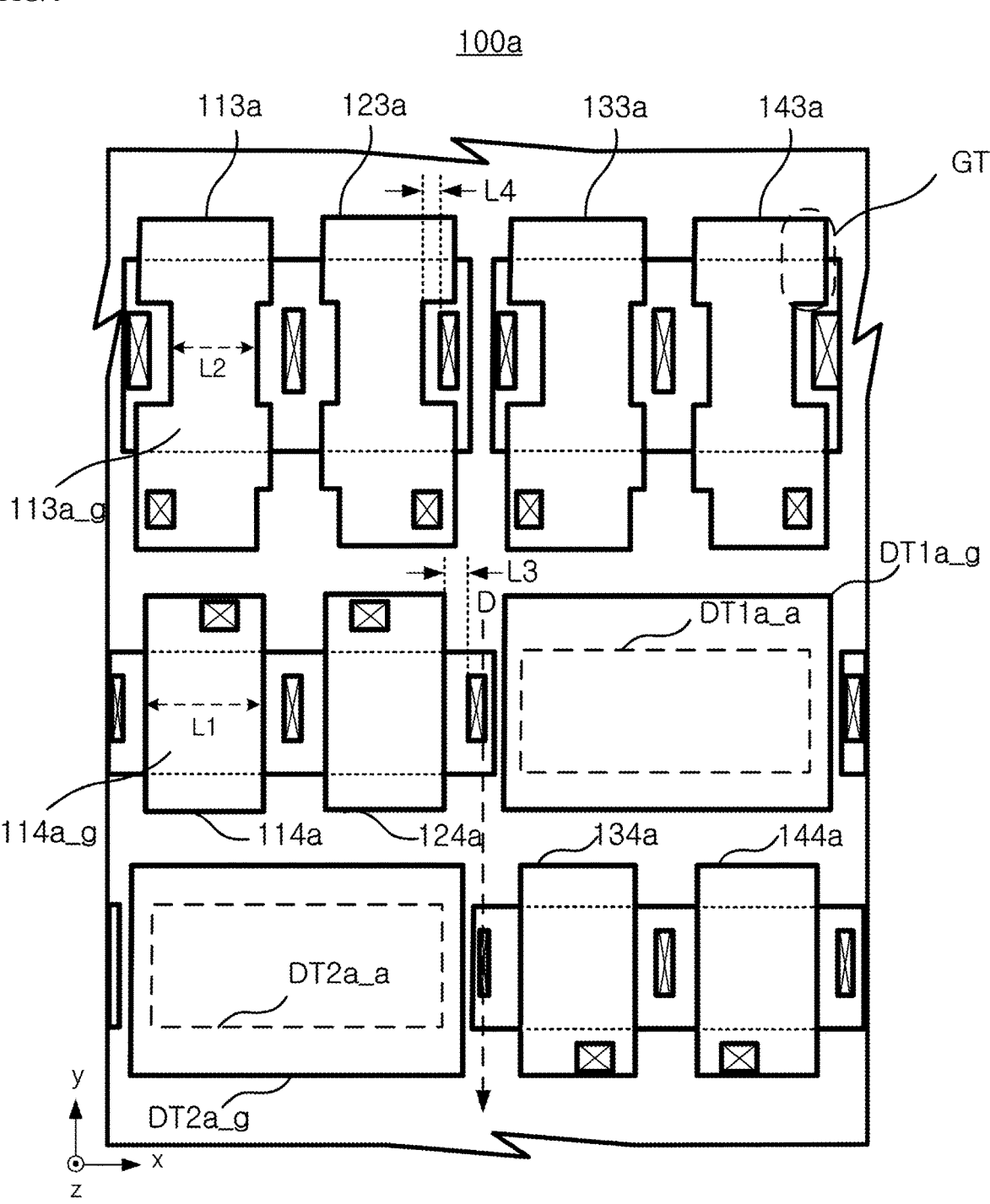
FIG. 5 is a plan view illustrating an example of a layout of transistors in a row decoder according to an example embodiment.

FIG. 5 illustrates an example of a layout of transistors of main wordline driving circuits 110, 120, 130, and 14 of the row decoder 100 according to an example embodiment. The layout of FIG. 5 will be described on the premise of the main wordline driving circuit described with reference to FIG. 3. While only PMOS transistors 113a, 123a, 133a, 143a and keeping transistors 114a, 124a, 134a, and 144a of a first inverter circuit of each of the main wordline driving circuits 110, 120, 130, and 140 are illustrated in FIG. 5, other transistors described with reference to FIG. 3 are omitted for brevity of the drawing. For ease of description, repeated or similar contents will be omitted or briefly described.

The PMOS transistors 113a, 123a, 133a, and 143a of the first inverter circuit of each of the main wordline driving circuit 110, 120, 130, and 140 of the row decoder 100 according to an example embodiment may be disposed in the same row. Although not illustrated, among a plurality of transistors functionally corresponding to each other in the main wordline driving circuits 110, 120, 130, and 140, some transistors may be disposed in the same row. Although not illustrated in FIG. 5, a plurality of rows may be formed in a direction (a Y-direction), perpendicular to a column structure of the wordline driving circuits 110, 120, 130, and 140. Alternatively, a plurality of rows may be formed in a direction (a Y-direction), perpendicular to a direction in which wordlines extend. The direction, in which wordlines extend, may be a direction in which main wordlines extend.

The PMOS transistors 113a, 123a, 133a, and 143a of the first inverter circuit may be disposed adjacent to the keeping transistors 114a, 124a, 134a, and 144a. For example, referring to FIG. 5, the PMOS transistors 113a, 123a, 133a, and 143a of the first inverter circuit may be disposed in a row directly above a row in which the keeping transistors 114a, 124a, 134a, and 144a are disposed. Moreover, the keeping transistors 114a, 124a, 134a, and 144a of the main wordline driving circuits 110, 120, 130, and 140 according to an example embodiment may be arranged in different rows.

FIG. 5 illustrates an example in which keeping transistors 114a, 124a, 134a, and 144a are disposed in different rows for each of two main wordline driving circuits, but at least a portion of the keeping transistors 114a, 124a, 134a, and 144a may be disposed in different rows according to another layout structure. Similarly to the above description, at least a portion of the keeping transistors 114a, 124a, 134a, and 144a may be disposed in different rows, and a layout margin may be obtained in a direction (an X-direction) along rows of the keeping transistors 114a, 124a, 134a, and 144a.

A gate length L1, a width of a gate 114a_g of the keeping transistor 114a along the row, may be greater than a length L2 of a gate 113a_g of a PMOS transistor 113a of a first inverter circuit. In addition, a distance L3 between a gate 124a_g of the keeping transistor 124a and a contact formed in an active region may be greater than a distance L4 between a gate of the PMOS transistor 123a of the first inverter circuit and the contact formed in the active region.

Each of the keeping transistors 114a, 124a, 134a, and 144a, disposed in different rows, may not include a gate tab. Referring to FIG. 5, a gate tab GT having a width greater than a width of the middle of a gate of a PMOS transistor 143a of the first inverter circuit may be formed in a distal end portion of the gate in the direction (the X-direction) in which rows extend. Gate tabs may also be formed in other PMOS transistors 113a, 123a, and 133a of the first inverter circuit. In contrast, each of the keeping transistors 114a, 124a, 134a, and 144a may not include a gate tab. For example, the gate width L1 of each of the keeping transistors 114a, 124a, 134a, and 144a is increased, so that each of the keeping transistors 114a, 124a, 134a, and 144a may not include a gate tab. According to some embodiments, transistors of the main wordline driving circuits 110, 120, 130, and 140, disposed in different rows, may overlap at least a portion of an active region when viewed in a direction, parallel to a plane of a substrate.

Referring to FIG. 5, in the keeping transistors 114a, 124a, 134a, and 144a disposed in different rows, an active region of the keeping transistor 124a may overlap an active region of the keeping transistor 134a when viewed in a direction (a Y-direction) of a row (D). A dummy gate and a dummy active region may be formed in a spare region formed by disposing transistors in different rows of the main wordline driving circuits 110, 120, 130, and 140 according to an example embodiment. For example, at least a portion of the transistors disposed in different rows of the main wordline driving circuits 110, 120, 130, and 140 may be disposed in the same row as a dummy gate and a dummy active region.

A structure including a dummy gate and a dummy active region may be referred to as a dummy transistor. The dummy gate and the dummy active region of the dummy transistor may not be connected to a signal line or a driving voltage. The dummy transistor may not perform functional operations such as signal transmission. Therefore, the dummy transistor may not have the same shape as a general transistor. For example, in the dummy active region, the source and drain regions may be formed as a single region, rather than being formed separately.

Continuing to refer to FIG. 5, a first dummy gate DT1*a*_g and a first dummy active region DT1*a*_a may be disposed in the same row as the keeping transistors 114*a* and 124*a*. A second dummy gate DT2*a*_g and a second dummy active region DT2*a*_a may be disposed in the same row as the keeping transistors 134*a* and 144*a*.

In an example embodiment, dummy gates DT1*a*_g and DT2*a*_g may have a larger area than dummy active regions DT1*a*_a and DT2*a*_a when viewed in a direction (a Z-direction), perpendicular to a plane of a substrate. Accordingly, outermost boundaries of the dummy gates DT1*a*_g and DT2*a*_g may include boundaries of the dummy active regions DT1*a*_a and DT2*a*_a when viewed in the direction (the Z-direction), perpendicular to the plane of the substrate.

As will be understood by those skilled in the art, the dummy gate and the dummy active region of the dummy transistor may be formed in the same process sequence as gates and active regions of transistors disposed in the same row to perform a portion of functions of the main wordline driving circuits 110, 120, 130, and 140.

Figure 6:
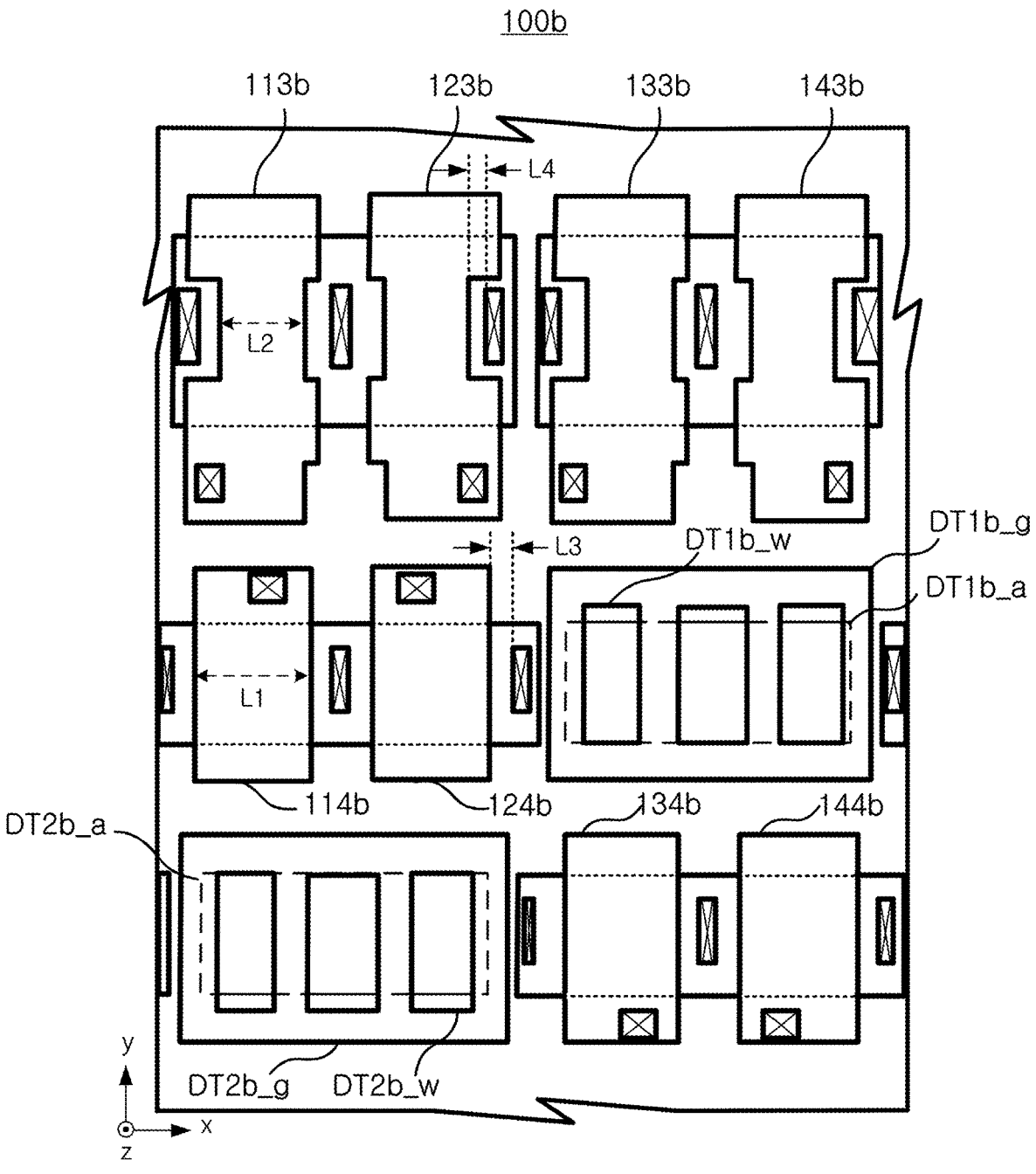
FIG. 6 is a plan view illustrating an example of a layout of transistors in a row decoder according to an example embodiment.

FIG. 6 illustrates an example of a layout of transistors of main wordline driving circuits 110, 120, 130, and 14 of the row decoder 100 according to an example embodiment. The layout of FIG. 6 will be described on the premise of the main wordline driving circuit described with reference to FIG. 3. Although only PMOS transistors 113*b*, 123*b*, 133*b*, 143*b* and keeping transistors 114*b*, 124*b*, 134*b*, and 144*b* of a first inverter circuit of each of the main wordline driving circuits 110, 120, 130, and 140, other transistors described with reference to FIG. 3 are omitted for brevity of the drawing. For ease of description, repeated or similar contents will be omitted or briefly described.

The keeping transistors 114*b*, 124*b*, 134*b*, and 144*b* of the main wordline driving circuits 110, 120, 130, and 140 may be disposed in different rows. A first dummy gate DT1*b*_g and a first dummy active region DT1*b*_a may be disposed in the same row as the keeping transistors 114*b* and 124*b*. A second dummy gate DT2*b*_g and a second dummy active region DT2*b*_a may be disposed in the same row as the keeping transistors 134*b* and 144*b*.

Referring to FIG. 6, when viewed in a direction (a Z-direction) perpendicular to a plane of a substrate, the first dummy gate DT1*b*_g and the second dummy gate DT2*b*_g may have at least partially hollow portions DT1*b*_w and DT2*b*_w, respectively. The hollow portions may be in the form of a plurality of windows DT1*b*_w and DT2*b*_w. Structures of the windows DT1*b*_w and DT2*b*_w of the gates DT1*b*_g and DT2*b*_g of the dummy transistors may allow a distribution of lengths or areas of transistors disposed in the same row as the dummy transistors, which may occur in some processing methods, to be reduced. The number of windows of the first dummy gate DT1*b*_g and the second dummy gate DT2*b*_g may vary according to example embodiments.

Figure 7:
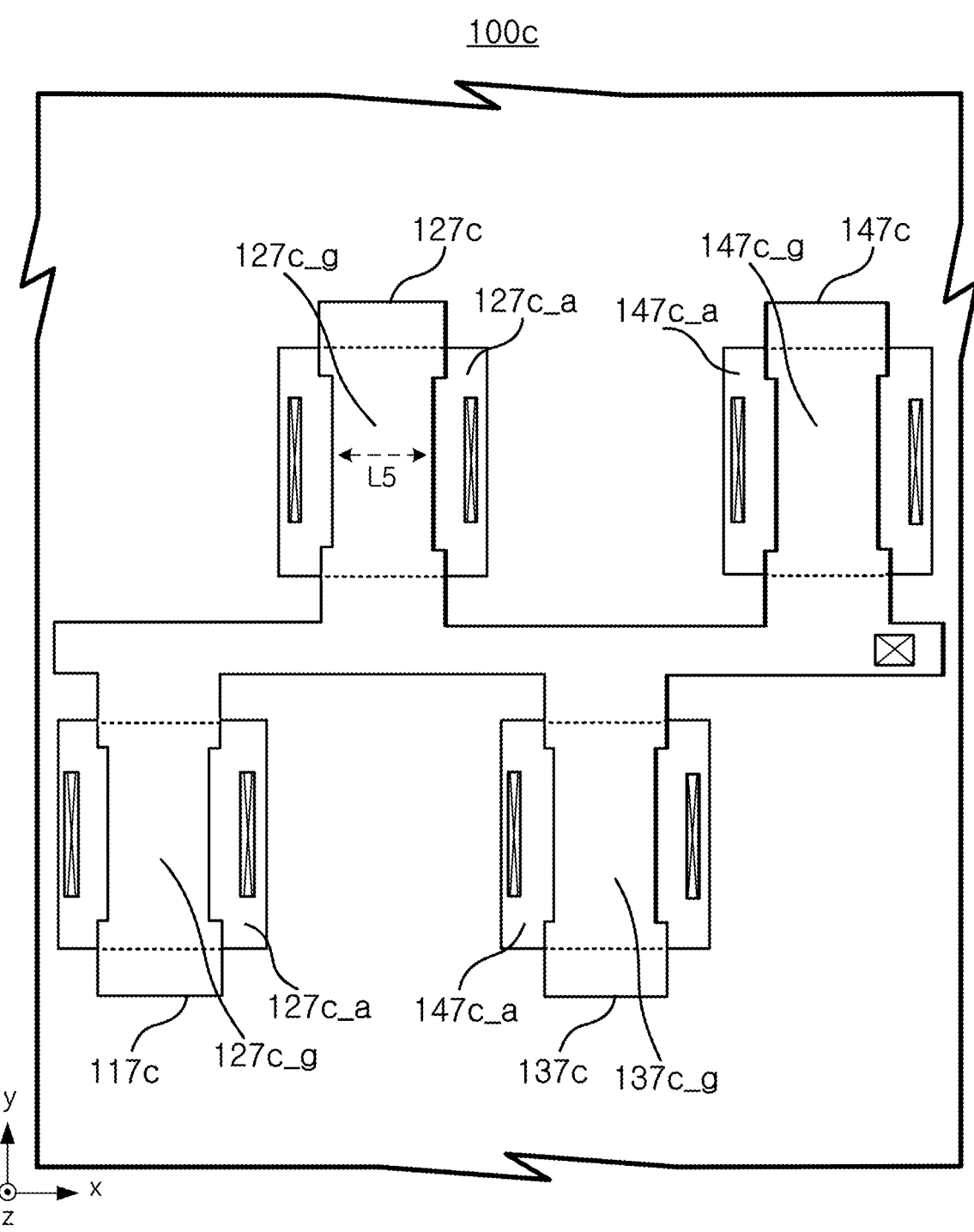
FIG. 7 is a plan view illustrating an example of a layout of transistors in a row decoder according to an example embodiment.

FIG. 7 illustrates an example of a layout of transistors of main wordline driving circuits 110, 120, 130, and 14 of the row decoder 100 according to an example embodiment. The layout of FIG. 7 will be described on the premise of the main wordline driving circuit described with reference to FIG. 3. Although only field relaxation transistors 117*c*, 127*c*, 137*c*, and 147*c* of the main wordline driving circuits 110, 120, 130, and 140 are illustrated in FIG. 7, other transistors described with reference to FIG. 3 are omitted for brevity of the drawing. For ease of description, repeated or similar contents will be omitted or briefly described. In some embodiments, the electric field relaxation transistors 117*c*, 127*c*, 137*c*, and 147*c* of the main wordline driving circuits 110, 120, 130, and 140 may be disposed in different rows.

Referring to FIG. 7, the field relaxation transistors 117*c*, 127*c*, 137*c*, and 147*c* of the main wordline driving circuits 110, 120, 130, and 14 may be alternately disposed in different rows. In FIG. 7, the field relaxation transistors 117*c*, 127*c*, 137*c*, and 147*c* are illustrated as being disposed for each main wordline driving circuit. However, the field relaxation transistors 117*c*, 127*c*, 137*c*, and 147*c* may be disposed in different rows for each of two main wordline driving circuits.

In an example embodiment, gates 117*c*_g, 127*c*_g, 137*c*_g, and 147*c*_g of the field relief transistors 117*c*, 127*c*, 137*c*, and 147*c* may be connected in common. However, example embodiments do not preclude that the gates 117*c*_g, 127*c*_g, 137*c*_g, and 147*c*_g of the field relaxation transistors 117*c*, 127*c*, 137*c*, and 147*c* are separately formed to include gate contacts, respectively.

The field relaxation transistors 117*c*, 127*c*, 137*c*, and 147*c* of the main wordline circuits 110, 120, 130, and 140 are not all disposed in the same row, but at least a portion of the field relaxation transistors 117*c*, 127*c*, 137*c*, and 147*c* are disposed in different rows. Accordingly, a layout margin may be obtained in a direction (an X-direction) along rows of a field relaxation transistor. As described above with reference to FIGS. 4 to 6, a width L5 of each of gates 117*c*_g, 127*c*_g, 137*c*_g, and 147*c*_g of the field relaxation transistors 117*c*, 127*c*, 137*c*, and 147*c* in the direction (the X-direction) along rows may be greater than a gate width of transistors disposed in the same row. A distance between contacts formed in the gates 117*c*_g, 127*c*_g, 137*c*_g, and 147*c*_g and the active regions 117*c*_a, 127*c*_a, 137*c*_a, and 147*c*_a of the field relaxation transistors 117*c*, 127*c*, 137*c*, and 147*c* may be greater than a distance between contacts formed in gates and active regions of transistors disposed in the same row. Accordingly, the field relaxation transistors 117*c*, 127*c*, 137*c*, and 147*c* may be prevented from deteriorating. As shown, in FIG. 7, each of the field relaxation transistors 117*c*, 127*c*, 137*c*, and 147*c* disposed in different rows are illustrated as being including a gate tab. However, each of the field relaxation transistors 117*c*, 127*c*, 137*c*, and 147*c* may not include a gate tab according to the gate width L5.

Figure 8:
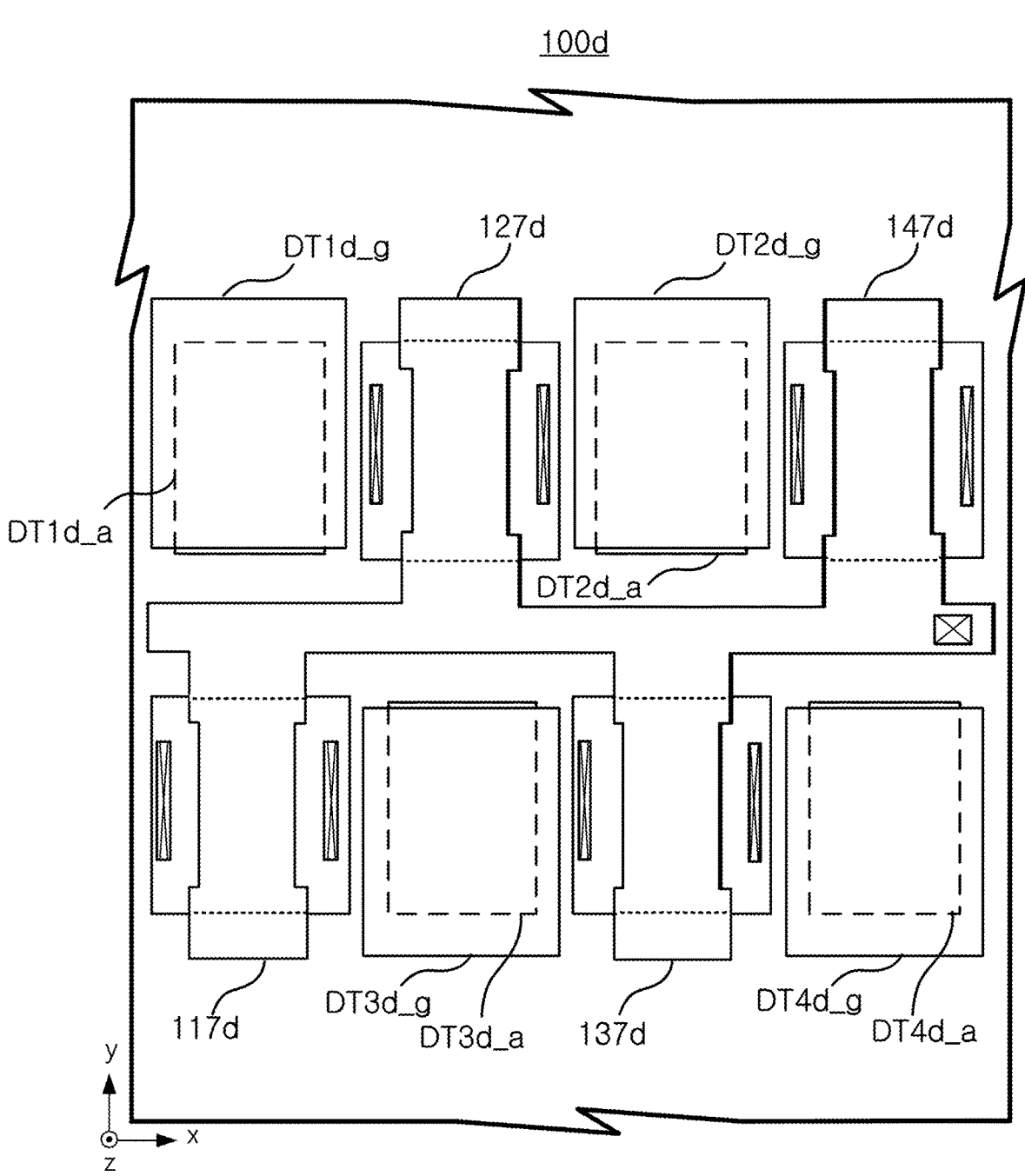
FIG. 8 is a plan view illustrating an example of a layout of transistors in a row decoder according to an example embodiment.

FIG. 8 illustrates an example of a layout of transistors of main wordline driving circuits 110, 120, 130, and 14 of the row decoder 100 according to an example embodiment. Although only field relaxation transistors 117*d*, 127*d*, 137*d*, and 147*d* of the main wordline driving circuits 110, 120, 130, and 140 are illustrated in FIG. 8, other transistors are omitted for brevity of the drawing. For ease of description, repeated or similar contents will be omitted or briefly described. The field relaxation transistors 117*d*, 127*d*, 137*d*, and 147*d* of the main wordline driving circuits 110, 120, 130, and 140 may be alternately arranged in different rows.

The field relaxation transistors 117*d*, 127*d*, 137*d*, and 147*d* of the entire main wordline driving circuits 110, 120, 130, and 140 may not be all arranged in the same row, but at least a portion of the field relaxation transistors 117*d*, 127*d*, 137*d*, and 147*d* may be arranged in different rows. Accordingly, a layout margin may be obtained in a direction (an X-direction) along rows of the field relaxation transistors.

The field relaxation transistors 117*d*, 127*d*, 137*d*, and 147*d*, disposed in different rows, may be disposed in the same row as dummy gates DT1*d_g*, DT2*d_g*, DT3*d_g*, and DT3*d_g* and dummy active regions DT1*d_a*, DT2*d_a*, DT3*d_a*, and DT3*d_a*. As described above, the dummy gates DT1*d_g*, DT2*d_g*, DT3*d_g*, and DT3*d_g* and the dummy active regions DT1*d_a*, DT2*d_a*, DT3*d_a*, and DT3*d_a* may be not connected to a signal line or a driving voltage.

The dummy gates DT1*d_g*, DT2*d_g*, DT3*d_g*, and DT3*d_g* and the dummy active regions DT1*d_a*, DT2*d_a*, DT3*d_a*, and DT3*d_a* of the dummy transistors may be formed in the same process sequence as the gates and active regions of the field relaxation transistors 117*d*, 127*d*, 137*d*, and 147*d*.

In an example embodiment, the dummy gates DT1*d_g*, DT2*d_g*, DT3*d_g*, and DT3*d_g* may have larger areas than the dummy active regions DT1*d_a*, DT2*d_a*, DT3*d_a*, and DT3*d_a* when viewed in a direction (a Z-direction), perpendicular to a plane of a substrate. Accordingly, outermost boundaries of the dummy gates DT1*d_g*, DT2*d_g*, DT3*d_g*, and DT3*d_g* may include at least a portion of boundaries of the dummy active regions DT1*d_a*, DT2*d_a*, DT3*d_a*, and DT3*d_a* when viewed in the direction (the Z-direction), perpendicular to the plane of the substrate.

Figure 9:
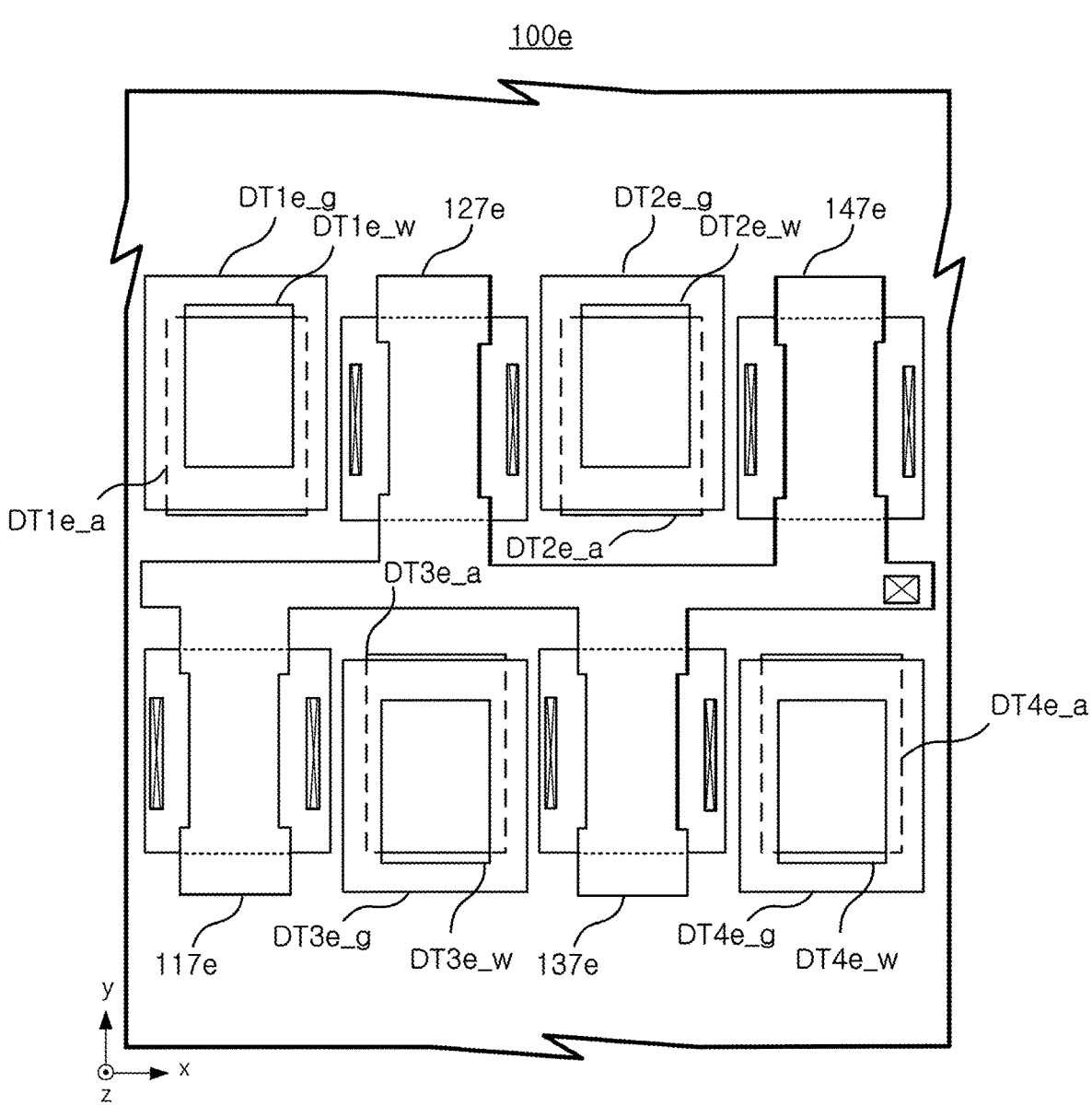
FIG. 9 is a plan view illustrating an example of a layout of transistors in a row decoder according to an example embodiment.

FIG. 9 illustrates an example of a layout of transistors of main wordline driving circuits 110, 120, 130, and 14 of the row decoder 100 according to an example embodiment. Although only field relaxation transistors 117*e*, 127*e*, 137*e*, and 147*e* of the main wordline driving circuits 110, 120, 130, and 140 are illustrated in FIG. 9, other transistors are omitted for brevity of the drawing. For ease of description, repeated or similar contents will be omitted or briefly described.

The field relaxation transistors 117*e*, 127*e*, 137*e*, and 147*e* of the main wordline driving circuits 110, 120, 130, and 140 may be alternately arranged in different rows. Example embodiments do not preclude that the field relaxation transistors 117*e*, 127*e*, 137*e*, and 147*e* are disposed in different rows for each of a plurality of main wordline driving circuits, unlike those illustrated in FIG. 9.

The field relaxation transistors 117*e*, 127*e*, 137*e*, and 147*e* of the entire main wordline circuits 110, 120, 130, and 140 are not all arranged in the same row, but at least a portion of the field relaxation transistors 117*e*, 127*e*, 137*e*, and 147*e* are disposed in different rows. Accordingly, a layout margin may be obtained in a direction (an X-direction) along rows of the field relaxation transistors. In the layout margin, dummy gates DT1*e_g*, DT2*e_g*, DT3*e_g*, and DT3*e_g* and dummy active regions DT1*e_a*, DT2*e_a*, DT3*e_a*, and DT3*e_a* may be disposed in the same row as the field relaxation transistors 117*e*, 127*e*, 137*e*, and 147*e*.

In an example embodiment, outermost boundaries of the dummy gates DT1*e_g*, DT2*e_g*, DT3*e_g*, and DT3*e_g* may include at least a portion of boundaries of the dummy active regions DT1*e_a*, DT2*e_a*, DT3*e_a*, and DT3*d_a* when viewed in a direction (a Z-direction), perpendicular to a plane of a substrate. The dummy gates DT1*e_g*, DT2*e_g*, DT3*e_g*, and DT3*e_g* and the dummy active regions DT1*e_a*, DT2*e_a*, DT3*e_a*, and DT3*e_a* of the dummy transistors may be formed in the same process sequence as gates and active regions of the field relaxation transistors 117*e*, 127*e*, 137*e*, and 147*e*. The dummy gates DT1*e_g*, DT2*e_g*, DT3*e_g*, and DT3*e_g* according to an example embodiment may have at least partially hollow portions DT1*e_w*, DT2*e_w*, DT3*e_w*, and DT3*e_w*. Structures of the windows DT1E_w, DT2E_w, DT3E_w, and DT3E_w of the dummy gates DT1*e_g*, DT2*e_g*, DT3*e_g*, and DT3*e_g* may allow a distribution of lengths or areas of the field relaxation transistors 117*e*, 127*e*, 137*e*, and 147*e*, disposed in the same row as the dummy transistors, to be reduced.

Figure 10:
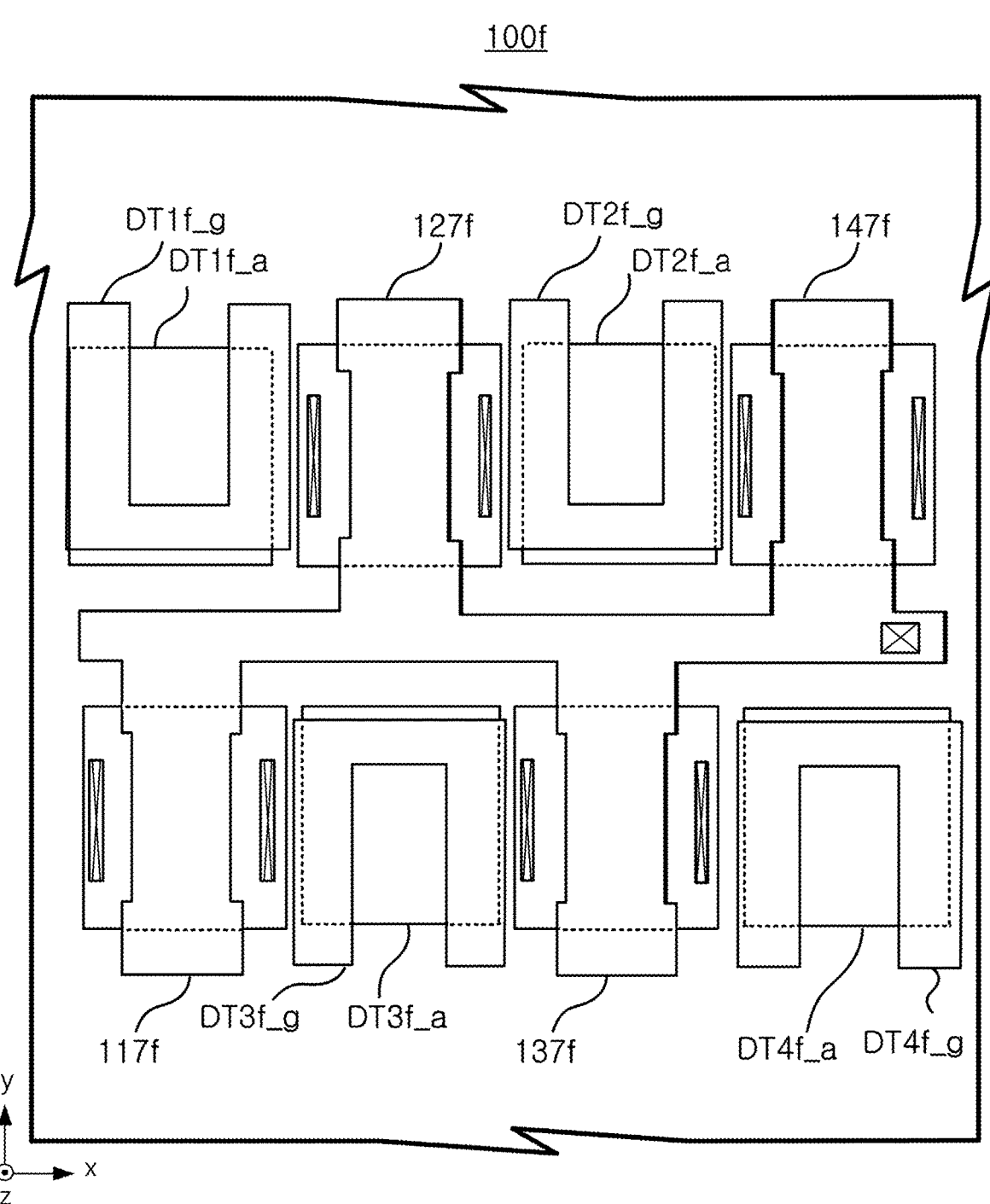
FIG. 10 is a plan view illustrating an example of a layout of transistors in a row decoder according to an example embodiment.

FIG. 10 illustrates an example of a layout of transistors of main wordline driving circuits 110, 120, 130, and 14 of the row decoder 100, according to an example embodiment. Although only field relaxation transistors 117*f*, 127*f*, 137*f*, and 147*f* of the main wordline driving circuits 110, 120, 130, and 140 are illustrated in FIG. 10, other transistors are omitted for brevity of the drawing. For ease of description, repeated or similar contents will be omitted or briefly described.

The field relaxation transistors 117*f*, 127*f*, 137*f*, and 147*f* of the main wordline driving circuits 110, 120, 130, and 140 may be alternately disposed in different rows. In addition, in a spare region of a row in which the field relaxation transistors 117*f*, 127*f*, 137*f*, and 147*f* are disposed, dummy gates DT1*f_g*, DT2*f_g*, DT3*f_g*, and DT3*f_g* and dummy active regions DT1*f_a*, DT2*f_a*, DT3*f_a*, and DT3*f_a* may be disposed in the same row as the field relaxation transistors 117*f*, 127*f*, 137*f*, and 147*f*.

The dummy gates DT1*f_g*, DT2*f_g*, DT3*f_g*, and DT3*f_g* and the dummy active regions DT1*f_a*, DT2*f_a*, DT3*f_a*, and DT3*f_a* of the dummy transistors may be formed in the same process sequence as gates and active regions of the field relaxation transistors 117*f*, 127*f*, 137*f*, and 147*f*.

When viewed in a direction perpendicular to a plane of a substrate, each of the dummy gates DT1*f_g*, DT2*f_g*, DT3*f_g*, and DT3*f_g* according to an example embodiment may have a horseshoe shape in which one side surface of each of the dummy gates DT1*f_g*, DT2*f_g*, DT3*f_g*, and DT3*f_g* is depressed.

A direction of the depressed side surface of each of the dummy gates DT1*f_g*, DT2*f_g*, DT3*f_g*, and DT3*f_g* may be a direction (a Y-direction) in which row extend. For example, the direction of the depressed side surface of each of the dummy gates DT1*f_g*, DT2*f_g*, DT3*f_g*, and DT3*f_g* may be a direction toward an upper side or a lower side with respect to FIG. 10. Alternatively, the direction of the depressed side surface of each of the dummy gates DT1*f_g*, DT2*f_g*, DT3*f_g*, and DT3*f_g* may be directed toward another transistor other than an adjacent field relaxation transistor.

The depressed horseshoe shape of each of the dummy gates DT1*f_g*, DT2*f_g*, DT3*f_g*, and DT3*f_g* may allow a distribution of distances between gates of transistors disposed in different rows and the dummy gates DT1*f_g*, DT2*f_g*, DT3*f_g*, and DT3*f_g*, which may occur in some processing methods, to be reduced.

Figure 11:
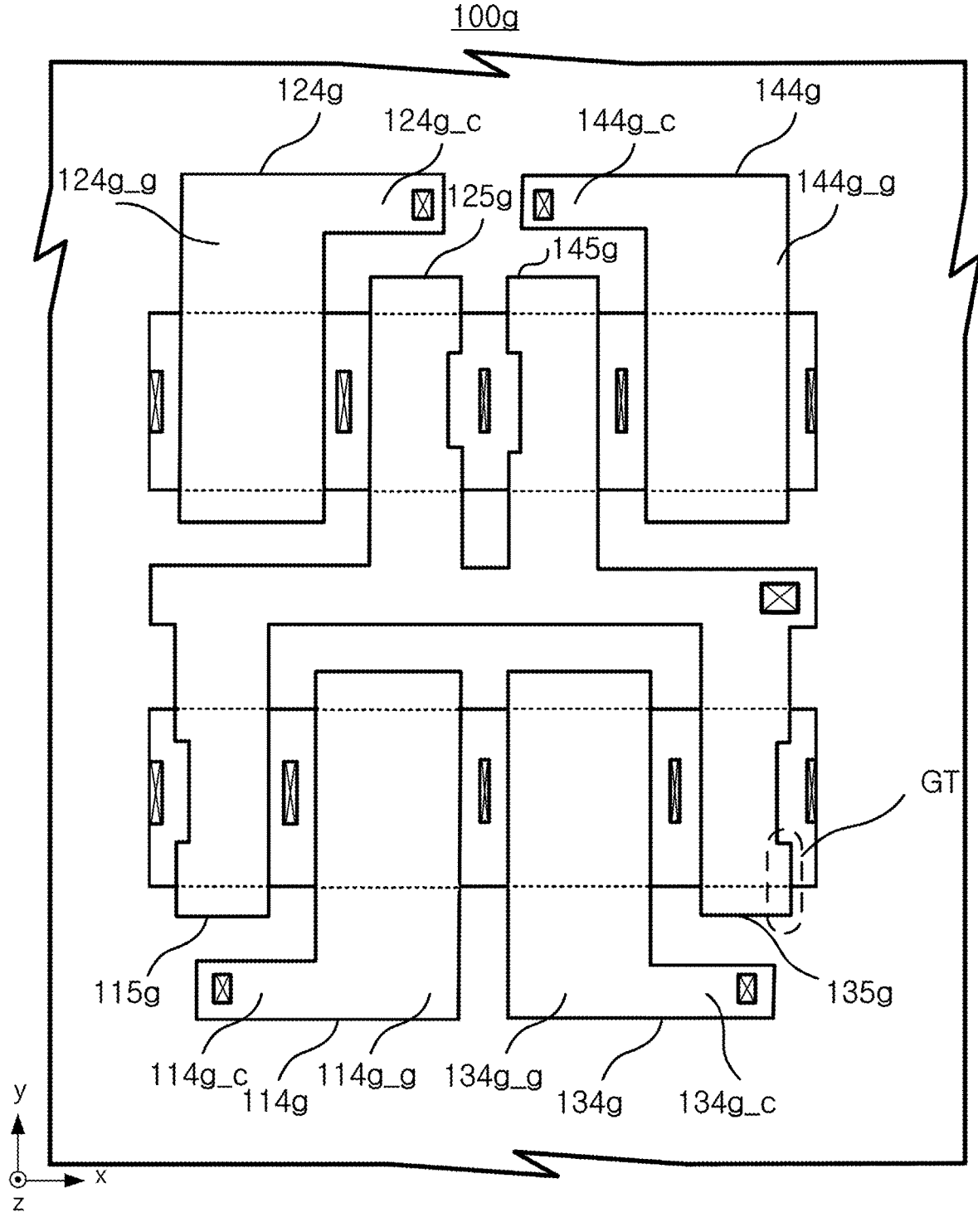
FIG. 11 is a plan view illustrating an example of a layout of transistors in a row decoder according to an example embodiment.

FIG. 11 illustrates an example of a layout of transistors of main wordline driving circuits 110, 120, 130, and 14 of the row decoder 100 according to an example embodiment. The layout of FIG. 11 will be described on the premise of the main wordline driving circuit described with reference to FIG. 3. Although only keeping transistors 114*g*, 124*g*, 134*g*, and 144*g* and PMOS transistors 115*g*, 125*g*, 135*g*, and 145*g* of each of the main wordline driving circuits 110, 120, 130, and 140 are illustrated in FIG. 11, other transistors described with reference to FIG. 3 are omitted for brevity of the drawing. For ease of description, repeated or similar contents will be omitted or briefly described. Furthermore, at least a portion of the keeping transistors 114g, 124g, 134g, and 144g and the PMOS transistors 115g, 125g, 135g, and 145g of each of the main wordline driving circuit 110, 120, 130, and 140 of the row decoder 100 according to an example embodiment may be disposed in different rows.

Referring to FIG. 11, the keeping transistors 114g, 124g, 134g, and 144g and the PMOS transistors 115g, 125g, 135g, and 145g may be alternately disposed in the same row. In an example embodiment, the keeping transistor and PMOS transistor of the same main wordline may be disposed in the same row. For example, the keeping transistor 114g and the PMOS transistor 115g of a first main wordline may be disposed in the same row. Similarly, the keeping transistor 124g and the PMOS transistor 125g of a second main wordline may be disposed in the same row, the keeping transistor 134g and the PMOS transistor 135g of a third main wordline may be disposed in the same row, and the keeping transistor 145g and the PMOS transistor 145g of a fourth main wordline may be disposed in the same row.

In an example embodiment, when viewed in a direction perpendicular to a plane of a substrate, a gate of a keeping transistor may have a bent portion. Referring to FIG. 11, gates 114g_g, 124g_g, 134g_g, and 144g_g of the keeping transistors 114g, 124g, 134g, and 144g may sequentially have bent portions 114g_c, 124g_c, 134g_c, and 144g_c. The bent portions 114g_c, 124g_c, 134g_c, and 144g_c may be bent in a direction toward the PMOS transistors 115g, 125g, 135g, and 145g constituting the same main wordline circuit as the keeping transistors 114g, 124g, 134g, and 144g. For example, the bent portions 114g_c, 124g_c, 134g_c, and 144g_c may have shapes protruding toward the PMOS transistors 115g, 125g, 135g, and 145g from a direction (a Y-direction) in which columns of gates 114g_g, 124g_g, 134g_g, and 144g_g of the keeping transistors 114g, 124g, 134g, 144g extend.

In an example embodiment, contacts for receiving a control signal may be formed in the bent portions 114g_c, 124g_c, 134g_c, and 144g_c of the gates 114g_g, 124g_g, 134g_g, and 144g_g of the keeping transistors 114g, 124g, 134g, and 144g. Accordingly, the bent portions 114g_c, 124g_c, 134g_c, and 144g_c of the gates 114g_g, 124g_g, 134g_g, and 144g_g of the keeping transistors 114g, 124g, 134g, and 144g may be formed in column locations constituting a main wordline driving circuit in which the keeping transistors 114g, 124g, 134g, and 144g are included. In the gates 114g_g, 124g_g, 134g_g, and 144g_g of the keeping transistors 114g, 124g, 134g, and 144g, body portions other than the bent portions 114g_c, 124g_c, 134g_c, and 144g_c may be formed in column locations constituting another main wordline driving circuit.

Referring to FIGS. 11 and 3, the bent portion 114g_c of the gate 114g_g of the keeping transistor 114g included in the first main wordline driving circuit 110 may be disposed in the same column as the PMOS transistor 113 of the first inverter circuit of the first main wordline driving circuit 110. The body portion of the gate 114g_g of the keeping transistor 114g, which is included in the first main wordline driving circuit 110, may be disposed in the same column as a PMOS transistor, not illustrated, of the first inverter circuit of the second main wordline driving circuit 120.

In an example embodiment, gates of the PMOS transistors 115g, 125g, 135g, and 145g may be connected in common. However, example embodiments do not preclude that the gates of the PMOS transistors 115g, 125g, 135g, and 145g are separately formed to include separate gate contacts, respectively.

In an example embodiment, the keeping transistors 114g, 124g, 134g, and 144g may share at least a portion of an active region with the PMOS transistors 115g, 125g, 135g, and 145g. The keeping transistors 114g, 124g, 134g, and 144g may share at least one of a source terminal or a drain terminal with the PMOS transistors 115g, 125g, 135g, and 145g.

In an example embodiment, gates of the keeping transistors 114g, 124g, 134g, and 144g may not constitute a gate tab in the vicinity of a boundary of an active region. In contrast, gates of the PMOS transistors 115g, 125g, 135g, and 145g may constitute a gate tab GT in the vicinity of the boundary of the active region.

As described above in example embodiments, in a main wordline driving circuit included in a row decoder, transistors disposed in different rows may be, for example, a keeping transistor and a field relaxation transistor. However, as a cell pitch of wordlines is shrunk, other transistors included in a main wordline driving circuit included in the row decoder, other than the keeping transistor and the field relaxation transistor, may be disposed in different rows.

As set forth above, according to example embodiments, a memory device and a row decoder are capable of preventing deterioration of a transistor and improving reliability.

While example embodiments have been shown and described above, it will be apparent to those skilled in the art that modifications and variations could be made without departing from the scope of the present inventive concept as defined by the appended claims.

What is claimed is:

1. A row decoder, comprising:

first and second main wordline driving circuits, which are configured to generate respective first and second driving signals onto corresponding first and second main wordlines extending adjacent to each other; and wherein a first transistor within the first main wordline driving circuit and a second transistor within the second main wordline driving circuit have the same function, but extend in different rows when viewed in a direction perpendicular to a substrate on which the first and second main wordlines are formed, and wherein the first transistor and the second transistor extend in different rows, among rows that are substantially perpendicular to a direction in which the first and second main wordlines extend.

2. The row decoder of claim 1, wherein the first transistor and the second transistor extend in different rows, among rows perpendicular to a column, when the first main wordline driving circuit and the second main wordline driving circuit are disposed in a structure of the column.

3. The row decoder of claim 2, wherein active regions of the first transistor and the second transistor are disposed to at least partially overlap each other when viewed in a direction parallel to a plane of the substrate.

4. The row decoder of claim 2, wherein the first transistor and the second transistor are disposed in the same row as a dummy transistor, comprising a dummy gate and a dummy active region, when viewed in a direction perpendicular to the substrate.

5. The row decoder of claim 4, wherein an outermost boundary of the dummy gate comprises at least a portion of a boundary of the dummy active region when viewed in a direction perpendicular to the substrate.

6. The row decoder of claim 4, wherein the dummy gate comprises an at least partially hollow portion when viewed in a direction perpendicular to the substrate.

7. The row decoder of claim 1, wherein each of the first main wordline driving circuit and the second main wordline driving circuit comprises:

a P-channel metal oxide semiconductor (PMOS) transistor having a gate terminal responsive to a precharge control signal, a source terminal electrically coupled to a driving voltage, and a drain terminal electrically connected to a series combination of a plurality of N-channel metal oxide semiconductor (NMOS) transistors;

a first inverter circuit and a second inverter circuit electrically connected in series, said first inverter circuit having an input terminal electrically coupled to the drain terminal of the PMOS transistor; and a keeping transistor having a gate terminal electrically coupled to an output terminal of the first inverter circuit, a source terminal electrically coupled to a driving voltage, and a drain terminal electrically coupled to the input terminal of the first inverter circuit; and wherein the plurality of NMOS transistors includes a field relaxation transistor electrically connected in series with the PMOS transistor.

8. The row decoder of claim 7, wherein each of the first transistor and the second transistor is the field relaxation transistor.

9. The row decoder of claim 7, wherein each of the first transistor and the second transistor is the keeping transistor.

10. The row decoder of claim 9, wherein a length of a minor axis, perpendicular to a direction of a major axis of a gate of the keeping transistor, is greater than a length of a minor axis of the PMOS transistor when viewed in a direction perpendicular to the substrate.

11. The row decoder of claim 9, wherein a first distance between a gate of the keeping transistor and a contact formed in an active region of the keeping transistor is greater than a second distance between a gate of the PMOS transistor and a contact formed in an active region of the PMOS transistor.

12. The row decoder of claim 9, further comprising:

a third main wordline driving circuit, adjacent to the first main wordline driving circuit, and a fourth main wordline driving circuit adjacent to the second main wordline driving circuit; and wherein a third transistor of the third main wordline driving circuit and a fourth transistor of the fourth main wordline driving circuit are configured to have the same function as the first transistor and the second transistor, and wherein the first transistor and the third transistor extend in the same row and the second transistor and the fourth transistor extend in the same row, but different from the same row in which the first transistor and the third transistor extend, when viewed in a direction perpendicular to the substrate.

13. The row decoder of claim 9, wherein the first transistor extends in the same row as the PMOS transistor of the second main wordline driving circuit when viewed in a direction perpendicular to the substrate.

14. The row decoder of claim 13, wherein the first transistor comprises a bent portion when viewed in the direction perpendicular to the substrate.

15. The row decoder of claim 14, wherein the bent portion is formed to protrude from a direction of a major axis of a gate of the first transistor to a direction in which the PMOS transistor is disposed.

16. The row decoder of claim 13, wherein the keeping transistor shares at least one of a source terminal and a drain terminal with the PMOS transistor.

17. The row decoder of claim 1, wherein the first transistor and the second transistor do not comprise a gate tab when viewed in a direction parallel to a plane of the substrate.

18. A row decoder, comprising:

a plurality of main wordline driving circuits disposed consecutively in a first direction parallel to a plane of a substrate and configured to respectively generate driving signals of different main wordlines;

wherein each of the plurality of main wordline driving circuits comprises a plurality of transistors disposed in a second direction, parallel to the plane and perpendicular to the first direction; and wherein in each of a first main wordline driving circuit and a second main wordline driving circuit, adjacent to each other, among the plurality of main wordline driving circuits, at least some of the plurality of transistors, which functionally correspond to each other, are disposed in different rows among a plurality of rows that extend along the first direction.

19. The row decoder of claim 18, wherein each of the first transistors is disposed in a row with a dummy transistor that comprises a dummy gate and a dummy active region, when viewed in a direction perpendicular to the substrate.

20. A memory device, comprising:

a first main wordline driving circuit, which is configured to provide a wordline driving signal to a first sub-wordline group, and a second main wordline driving circuit, which is configured to provide a wordline driving signal, onto a corresponding main word line, to a second sub-wordline group;

wherein first transistors, which perform the same function in each of the first main wordline driving circuit and the second main wordline driving circuit, are disposed in different rows when viewed in a direction perpendicular to a plane of a substrate;

wherein each of the first sub-wordline group and the second sub-wordline group comprises a plurality of sub-wordline drivers; and wherein each of the rows extends along a first direction substantially perpendicular to a second direction in which the main wordline extends.

* * * * *